(12) United States Patent
Gilet et al.

(10) Patent No.: US 9,537,050 B2
(45) Date of Patent: Jan. 3, 2017

(54) OPTOELECTRONIC DEVICE AND METHOD FOR MANUFACTURING SAME

(71) Applicants: Commissariat à l'énergie atomique et aux énergies alternatives, Paris (FR); Aledia, Grenoble (FR)

(72) Inventors: Philippe Gilet, Teche (FR); Alexei Tchelnokov, Meylan (FR); Ivan Christophe Robin, Grenoble (FR)

(73) Assignees: Commissariat a l'energie atomique et aux energies alternatives (FR); Aledia (FR)

( * ) Notice: Subject to any disclaimer, the term of this patent is extended or adjusted under 35 U.S.C. 154(b) by 0 days.

(21) Appl. No.: 14/891,258

(22) PCT Filed: May 13, 2014

(86) PCT No.: PCT/FR2014/051111
§ 371 (c)(1),
(2) Date: Nov. 13, 2015

(87) PCT Pub. No.: WO2014/184487
PCT Pub. Date: Nov. 20, 2014

(65) Prior Publication Data
US 2016/0126416 A1    May 5, 2016

(30) Foreign Application Priority Data

May 14, 2013   (FR) ...................... 13 54287

(51) Int. Cl.
*H01L 33/06* (2010.01)
*H01L 33/20* (2010.01)
(Continued)

(52) U.S. Cl.
CPC ........... *H01L 33/20* (2013.01); *H01L 31/0264* (2013.01); *H01L 31/035227* (2013.01);
(Continued)

(58) Field of Classification Search
USPC ........................................... 257/101
See application file for complete search history.

(56) References Cited

U.S. PATENT DOCUMENTS

| 4,439,910 A | 4/1984 | Vasudev |
| 5,283,447 A | 2/1994 | Olbright et al. |

(Continued)

FOREIGN PATENT DOCUMENTS

| EP | 0544512 A1 | 6/1993 |
| EP | 0803948 A2 | 10/1997 |

(Continued)

OTHER PUBLICATIONS

Written Oponion of the international searching authority, issued in counterpart PCT international application No. PCT/FR2014/051111, dated Jul. 28, 2014.*

(Continued)

*Primary Examiner* — Thao P Le
(74) *Attorney, Agent, or Firm* — Kaplan Breyer Schwarz & Ottesen, LLP (57) ABSTRACT

The invention relates to an optoelectronic device and to the method for manufacturing same. The optoelectronic device (45), according to the invention includes, in particular: a semiconductor substrate (46) doped with a first type of conductivity; semiconductor contact pads (18) or a semiconductor layer on a surface (16) of the substrate which are/is respectively doped with a second type of conductivity that is the opposite of the first type; and semiconductor elements (24), each semiconductor element being in contact with a contact pad or with the layer.

11 Claims, 4 Drawing Sheets

(51) Int. Cl.
*H01L 31/0352* (2006.01)
*H01L 33/00* (2010.01)
*H01L 33/04* (2010.01)
*H01L 33/14* (2010.01)
*H01L 33/18* (2010.01)
*H01L 31/0264* (2006.01)
*H01L 31/18* (2006.01)
*H01L 33/34* (2010.01)
*B82Y 20/00* (2011.01)
*H01L 33/08* (2010.01)
*H01L 33/24* (2010.01)
*H01L 33/32* (2010.01)

(52) U.S. Cl.
CPC .. *H01L 31/035281* (2013.01); *H01L 31/1804* (2013.01); *H01L 33/005* (2013.01); *H01L 33/0016* (2013.01); *H01L 33/04* (2013.01); *H01L 33/14* (2013.01); *H01L 33/18* (2013.01); *H01L 33/343* (2013.01); *B82Y 20/00* (2013.01); *H01L 33/08* (2013.01); *H01L 33/24* (2013.01); *H01L 33/32* (2013.01)

(56) References Cited

U.S. PATENT DOCUMENTS

| | | | | |
|---|---|---|---|---|
| 7,598,544 B2 * | 10/2009 | Bertin | ............ | B82Y 10/00 257/213 |
| 7,994,527 B2 * | 8/2011 | DenBaars | ............ | H01L 33/58 257/95 |
| 8,183,587 B2 * | 5/2012 | Samuelson | ............ | B82Y 10/00 257/79 |
| 8,357,921 B2 * | 1/2013 | Bertin | ............ | B82Y 10/00 257/204 |
| 2003/0123829 A1 * | 7/2003 | Taylor | ............ | H01L 29/7785 385/131 |
| 2004/0089898 A1 * | 5/2004 | Ruhnau | ............ | H01L 31/0203 257/343 |
| 2006/0289891 A1 * | 12/2006 | Hutchins | ............ | B82Y 20/00 257/103 |
| 2011/0005570 A1 * | 1/2011 | Jain | ............ | B82Y 20/00 136/244 |
| 2011/0140072 A1 | 6/2011 | Varangis et al. | | |
| 2011/0227037 A1 * | 9/2011 | Su | ............ | C23C 16/0227 257/13 |
| 2012/0001303 A1 | 1/2012 | Huang et al. | | |
| 2016/0149075 A1 * | 5/2016 | Atanackovic | ............ | H01L 33/06 257/13 |

FOREIGN PATENT DOCUMENTS

| | | |
|---|---|---|
| WO | 0045443 A1 | 8/2000 |
| WO | 2009072631 A1 | 11/2009 |
| WO | 2012136665 A1 | 10/2012 |

OTHER PUBLICATIONS

"International Search Report"; issued in counterpart International Application No. PCT/FR2014/051111; on Jul. 28, 2014 by the EPO as International Searching Authority.

"International Search Report"; issued in International Application No. PCT/FR2014/051110; on Aug. 11, 2014 by the EPO as International Searching Authority.

Chen, et al., "Homoepitaxial growth of catalyst-free GaN wires on N-polar substrates", "Applied Physics Letters", Oct. 13, 2010, pp. 151909-1-151909-3, vol. 97, No. 151909, Publisher: American Institute of Physics; doi: 10.1063/1.3497078; XP-12137241.

Krames, et al., "High-power truncated-inverted-pyramid (AlxGa1-x) 0 .5In0 .5 P/GaP light-emitting diodes exhibiting >50% external quantum efficiency", "Applied Physics Letters", Oct. 18, 1999, pp. 2365-2367, vol. 75, No. 16, Publisher: American Institute of Physics; XP-12023753A.

* cited by examiner

OPTOELECTRONIC DEVICE AND METHOD FOR MANUFACTURING SAME

The present patent application claims the priority benefit of French patent application FR13/54287 which is herein incorporated by reference.

BACKGROUND

The present invention generally relates to semiconductor materials, to devices based on semiconductor materials, and to the manufacturing methods thereof. The present invention more specifically relates to devices comprising three-dimensional elements, and especially semiconductor microwires or nanowires.

DISCUSSION OF THE RELATED ART

Microwires or nanowires based on a component mainly containing a group-III element and a group-V element (for example, gallium nitride GaN), called III-V compound hereafter, or mainly containing a group-II element and a group-VI element (for example, zinc oxide ZnO), called II-VI compound hereafter, are examples of microwires or nanowires comprising a semiconductor material. Such microwires or nanowires enable to manufacture semiconductor devices such as optoelectronic devices. Term "optoelectronic devices" is used to designate devices capable of converting an electric signal into an electromagnetic radiation or the other way, and especially devices dedicated to the detection, the measurement, or the emission of an electromagnetic radiation or devices dedicated to photovoltaic applications.

SUMMARY

Thus, an embodiment provides an optoelectronic device comprising:

a doped semiconductor substrate of a first conductivity type;

semiconductor pads or a semiconductor layer on a surface of the substrate, doped with a second conductivity type opposite to the first type; and semiconductor elements, each semiconductor element being in contact with a pad or with the layer.

According to an embodiment, the dopant concentration of the pads or of the layer is greater than $10^{19}$ atoms/cm$^3$.

According to an embodiment, the dopant concentration of the substrate is greater than $10^{19}$ atoms/cm$^3$.

According to an embodiment, each semiconductor element comprises at least a portion, in contact with the associated pad or with the layer, doped with the second conductivity type.

According to an embodiment, the dopant concentration of the semiconductor elements is greater than $10^{19}$ atoms/cm$^3$.

According to an embodiment, the device further comprises a portion covering at least the lateral sides of each pad, said portion preventing the growth of the semiconductor elements on the lateral sides.

According to an embodiment, the device further comprises a dielectric region extending in the substrate from said surface and connecting, for each pair of pads, one of the pads in the pair to the other pad in the pair.

According to an embodiment, the substrate is made of a first semiconductor material selected from the group comprising silicon, germanium, a silicon-germanium alloy, silicon carbide, a III-V compound, such as GaN, GaAs, GaP, or GaSb, or ZnO, and a combination of these compounds. According to an embodiment, the substrate is made of silicon, particularly of single-crystal silicon.

According to an embodiment, said portion mainly comprises a second semiconductor material selected from the group comprising silicon, germanium, silicon carbide, a III-V compound, a II-VI compound, and a combination of these compounds.

According to an embodiment, the thickness of each pad is in the range from 1 nm to 100 nm and the substrate is in electric contact with each pad.

According to an embodiment, each semiconductor element is a microwire, a nanowire, or a conical or tapered element with a polygonal base.

According to an embodiment, the pads or the layer are made of a material selected from the group comprising aluminum nitride, boron nitride, silicon carbide, magnesium nitride, magnesium gallium nitride, or of a combination thereof and of their nitrided compounds.

According to an embodiment, each semiconductor element is at least partially covered with a semiconductor structure capable of emitting or capturing light.

An embodiment comprises a method of manufacturing an optoelectronic device, comprising the successive steps of:

providing a doped semiconductor substrate of a first conductivity type;

forming, on a surface of the substrate, pads or a layer doped with a second conductivity type opposite to the first type; and forming semiconductor elements, each element being in contact with a pad or with the layer.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

For clarity, the same elements have been designated with the same reference numerals in the various drawings and, further, as usual in the representation of electronic circuits, the various drawings are not to scale. Further, only those elements which are useful to the understanding of the present description have been shown and will be described. In particular, the means for controlling the optoelectronic device described hereafter are within the abilities of those skilled in the art and are not described.

In the following description, unless otherwise indicated, terms "substantially", "approximately", and "in the order of" mean "to within 10%". Further, "compound mainly formed of a material" or "compound based on a material" means that a compound comprises a proportion greater than or equal to 95% of said material, this proportion being preferably greater than 99%.

The present invention relates to the manufacturing of three-dimensional elements, for example, microwires, nanowires, or pyramid-shaped elements. In the following description, embodiments are described for the manufacturing of microwires or nanowires. However, these embodiments may be implemented for the manufacturing of three-dimensional elements other than microwires or nanowires, for example, for the manufacturing of pyramid-shaped three-dimensional elements.

Term "microwire" or "nanowire" designates a three-dimensional structure having an elongated shape along a preferred direction, having at least two dimensions, called minor dimensions, in the range from 5 nm to 2.5 μm, preferably from 50 nm to 2.5 μm, the third dimension, called major dimension, being at least equal to 1 time, preferably at least 5 times, and more preferably still at least 10 times, the largest minor dimension. In certain embodiments, the minor dimensions may be smaller than or equal to approximately 1 μm, preferably in the range from 100 nm to 1 μm, more preferably from 100 nm to 300 nm. In certain embodiments, the height of each microwire or nanowire may be greater than or equal to 500 nm, preferably in the range from 1 μm to 50 μm.

In the following description, term "wire" is used to mean "microwire or nanowire". Preferably, the median line of the wire which runs through the centers of gravity of the cross-sections, in planes perpendicular to the preferred direction of the wire, is substantially rectilinear and is called "axis" of the wire hereafter.

The cross-section of the wires may have different shapes, such as, for example, an oval, circular, or polygonal shape, particularly triangular, rectangular, square, or hexagonal. It should thus be understood that term "diameter" mentioned in relation with a cross-section of a wire or of a layer deposited on this wire designates a quantity associated with the surface area of the targeted structure in this cross-section, corresponding, for example, to the diameter of the disk having the same surface area as the wire cross-section.

The wires may at least partly be formed based on at least one semiconductor material. The semiconductor material may be silicon, germanium, silicon carbide, a III-V compound, a II-VI compound, or a combination of these compounds.

The wires may be at least partly formed of semiconductor materials mainly comprising a III-V compound, for example, III-N compounds. Examples of group-III elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Generally, the elements in the III-V compound may be combined with different molar fractions.

The wires may be at least partly formed based on semiconductor materials mainly comprising a II-VI compound. Examples of group-II elements comprise group-IIA elements, particularly beryllium (Be) and magnesium (Mg), and group-IIB elements, particularly zinc (Zn) and cadmium (Cd). Examples of group-VI elements comprise group-VIA elements, particularly oxygen (O) and tellurium (Te). Examples of II-VI compounds are ZnO, ZnMgO, CdZnO, or CdZnMgO. Generally, the elements in the II-VI compound may be combined with different molar fractions.

In certain embodiments, the wires may comprise a dopant. As an example, for III-V compounds, the dopant may be selected from the group comprising a group-II P-type dopant, for example, magnesium (Mg), zinc (Zn), cadmium (Cd), or mercury (Hg), a group-IV P-type dopant, for example, carbon (C), or a group-IV N-type dopant, for example, silicon (Si), germanium (Ge), selenium (Se), sulfur (S), terbium (Tb), or tin (Sn).

The wires are formed on a substrate. The substrate may correspond to a one-piece structure or correspond to a layer covering a support made of another material. The substrate for example is a semiconductor substrate such as a substrate made of silicon, germanium, a silicon-germanium alloy, silicon carbide, a III-V compound, such as GaN, GaAs, GaP or GaSb, or a ZnO substrate, or a combination of these compounds.

A seed layer or pads or islands, also called seed islands hereafter, are formed on a surface of a substrate. The seed layer or the seed islands are made of a material favoring the wire growth. In the case of seed pads, a treatment is further provided to protect the lateral sides of the seed islands and the surface of the substrate portions which are not covered with the seed islands to form a dielectric region on the lateral sides of the seed islands and extending on top and/or inside of the substrate and connecting, for each pair of pads, one of the pads in the pair to the other pad in the pair, with no wire growth on the dielectric region.

The fact of saying that a compound based on at least one first element and on a second element has a polarity of the first element and a polarity of the second element means that the material grows along a preferred direction and that when the material is cut in a plane perpendicular to the preferred growth direction, the exposed surface essentially comprises atoms of the first element in the case of the polarity of the first element or the atoms of the second element in the case of the polarity of the second element.

The material forming the seed layer or the seed islands is selected to favor the wire growth according to the same polarity. As an example, when the wires mainly comprise a III-V compound, the material forming the seed islands is preferably selected to favor the growth of the III-V compound according to the polarity of the group-V element. The III-V compound then grows according to the polarity of the group-V element on the seed islands, from the top of each seed island, and grows neither on the lateral sides of the seed islands nor on the rest of the substrate. Further, the inventors have shown that each wire then grows according to a substantially constant polarity in the entire wire. When the wires mainly comprise a II-VI compound, the material forming the seed islands is preferably selected to promote the growth of the II-VI compound according to the polarity of the group-VI element. The II-VI compound then grows according the polarity of the group-VI element on the seed islands, from the top of each seed island, and grows neither on the lateral sides of the seed islands nor on the rest of the substrate.

In the case of a III-V compound where the group-V element is nitrogen, the material forming the islands may be a material favoring the growth of a wire according to the N polarity. As an example, the islands may be made of aluminum nitride (AlN), of boron nitride (BN), of silicon carbide (SiC), of magnesium nitride in $Mg_xN_y$ form, where x is approximately equal to 3 and y is approximately equal to 2, for example magnesium nitride in $Mg_3N_2$ form or gallium and magnesium nitride (MgGaN), or of a combination thereof and of the nitrided compounds thereof. Preferably, the material forming the seed islands is aluminum nitride.

The wire growth method may be a method such as chemical vapor deposition (CVD) or metal-organic chemical vapor deposition (MOCVD), also known as metal-organic vapor phase epitaxy (MOVPE). However, methods such as molecular-beam epitaxy (MBE), gas-source MBE (GSMBE), metal-organic MBE (MOMBE), plasma-assisted MBE (PAMBE), atomic layer epitaxy (ALE), or hydride vapor phase epitaxy (HVPE) may be used. However, electrochemical processes may be used, for example, chemical bath deposition (CBD), hydrothermal processes, liquid aerosol pyrolysis, or electrodeposition.

As an example, the method may comprise injecting into a reactor a precursor of a group-III element and a precursor of a group-V element. Examples of precursors of group-III elements are trimethylgallium (TMGa), triethylgallium (TEGa), trimethylindium (TMIn), or trimethylaluminum (TMAl). Examples of precursors of group-V elements are ammonia ($NH_3$), tertiarybutylphosphine (TBP), arsine ($AsH_3$), or unsymmetrical dimethylhydrazine (UDMH).

According to an embodiment of the invention, in a first phase of growth of the wires of the III-V compound, a precursor of an additional element is added in excess, in addition to the precursors of the III-V compound. The additional element may be silicon (Si). An example of a precursor of silicon is silane ($SiH_4$).

Figure 1:
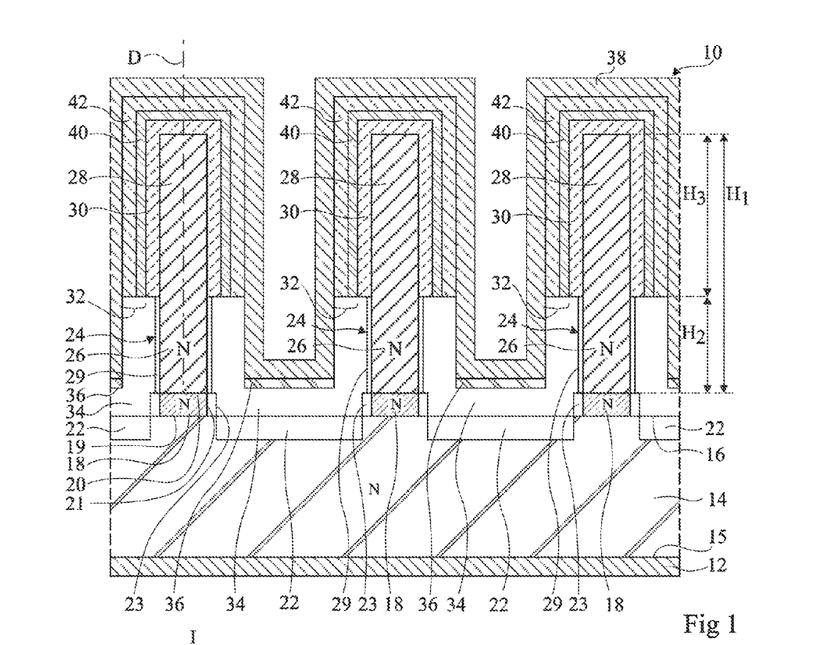
FIG. 1 is a partial simplified cross-section view of an example of an optoelectronic device comprising microwires or nanowires.

FIG. 1 is a partial simplified cross-section view of an example of an optoelectronic device 10 formed from wires such as previously described and capable of emitting an electromagnetic radiation.

Device 10 comprises, from bottom to top in FIG. 1:
a first biasing electrode 12;
a semiconductor substrate 14 comprising opposite surfaces 15 and 16, surface 15 being in contact with electrode 12;
seed islands 18 favoring the growth of wires and arranged on surface 16, each island 18 comprising a lower surface 19 in contact with surface 16 of substrate 14, an upper surface 20, opposite to surface 19, and at a distance from surface 19, and lateral surfaces 21, or lateral sides, connecting lower surface 19 to upper surface 20;
a region 22 in substrate 14, extending between each pair of islands 18 from surface 16 down to part of the depth of substrate 14, region 22 being made of a dielectric, resulting from the substrate transformation, which protects the underlying substrate and prevents the growth of wires;
insulating portions 23 covering lateral surfaces 21 and surrounding each island 18, insulating portions 23 preventing the wire growth;
wires 24 (three wires being shown) of height $H_1$, each wire 24 being in contact with surface 20 of one of islands 18, each wire 24 comprising a lower portion 26, of height $H_2$, in contact with island 18 and an upper portion 28, of height $H_3$, in contact with lower portion 26;
a passivating layer 29 covering the periphery of each lower portion 26;
an active layer 30 covering each upper portion 28;
one semiconductor layer 32 or more covering each active layer 30;
insulating portions 34 covering surface 16 between wires 24 and each wire 24 at least up to height $H_2$;
a reflective portion 36 covering insulating portions 34 between wires 24; and
a second electrode layer 38 covering semiconductor layers 32 and insulating portions 34.

Substrate 14 for example is a semiconductor substrate, such as a silicon substrate. Substrate 14 is doped with a first conductivity type, for example, N-type doped. Surfaces 15 and 16 may be planar and parallel. Surface 16 of substrate 14 may be a <100> surface.

Electrode 12 may correspond to a conductive layer which extends on surface 15 of substrate 14. The material forming electrode 12 is, for example, nickel silicide (NiSi), aluminum (Al), aluminum silicide (AlSi), titanium (Ti), or titanium silicide (TiSi). This layer may be covered with another metal layer, for example, gold, copper, or eutectics (Ti/Ni/Au or Sn/Ag/Cu) in the case of a soldering.

Islands 18 are located on surface 16 so that they protrude from surface 16. Top 20 of each island 18 is thus in a different plane than surface 16. Each island 18 has a preferred texturing and, when the material forming each island comprises an alloy of at least two elements, a preferred polarity. Preferred texturing means that the crystals forming islands 18 have a preferred growth direction, which is the same for all islands 18. Preferred polarity means that islands 18 all substantially have the same polarity. This means that when the material forming each island comprises an alloy of at least two elements, when the material is cut in a plane perpendicular to the preferred growth direction of the material, the exposed surface essentially comprises atoms of the same element for each island 18. Each island 18 has the same conductivity type as substrate 14 to decrease the interface resistance between islands 18 and substrate 14. Each island 18 may have any type of shape, for example rectangular, polygonal, circular, square, or oval. Preferably, the average diameter of seed island 18 is of the same order of magnitude as the average diameter of wire 20 intended to grow on seed island 18.

Insulating portions 23 may be made of a material deposited on sides 21 of seed islands 18. The material may be conformally deposited, for example, by CVD. It for example is silicon oxide ($SiO_2$), silicon nitride ($Si_xN_y$, where x is approximately equal to 3 and y is approximately equal to 4, for example, $Si_3N_4$), aluminum oxide ($Al_2O_3$), hafnium oxide ($HfO_2$), or diamond. Insulating portions 23 may further be made of a dielectric material resulting from the transformation of the material forming seed islands 18. The material forming protection portions 23 may then correspond to an oxide of the examples of materials of previously-described seed islands 18. As an example, the thickness of insulating portions 23 is in the range from 5 nm to 100 nm, for example, equal to approximately 30 nm.

Region 22 may partly extend under certain islands 18 or under each island 18. However, semiconductor substrate 14 should remain in electric contact with each island 18. The forming conditions of regions 22 are thus selected so that regions 22 extend at most along a length shorter than half the greatest length of the wire cross-section. As an example, the depth of each region 22 is in the range from 5 nm to 100 nm, for example, 10 nm.

The centers of two adjacent islands 18 may be distant by from 0.5 µm to 10 µm, and preferably by from 1.5 µm to 4 µm. As an example, islands 18 may be regularly distributed on substrate 14, region 22 forming a grid surrounding each island 18. As an example, islands 18 may be distributed in a hexagonal network.

Each wire 24 has a semiconductor structure elongated along an axis D substantially perpendicular to surface 16.

Each wire 24 may have a general elongated cylindrical shape with a hexagonal base. The average diameter of each wire 24 may be in the range from 50 nm to 2.5 µm and height $H_1$ of each wire 24 may be in the range from 250 nm to 50 •m.

Lower portion 26 of each wire 24 is mainly formed of the III-N compound, for example, gallium nitride, having a doping of the first conductivity type, for example, doped with silicon. The periphery of lower portion 26 is covered with dielectric layer 29, for example SiN, up to height $H_2$ from the end of lower portion 26 in contact with the associated island 18. Height $H_2$ may be in the range from 100 nm to 25 µm. Dielectric material layer 29 has a thickness between one atomic monolayer and 100 nm, preferably between one atomic monolayer and 10 nm.

Upper portion 28 of each wire 24 is for example at least partly made of a III-N compound, for example, GaN. Upper portion 28 may have a doping of the first conductivity type, or may not be intentionally doped. Upper portion 28 extends up to height $H_3$ which may be in the range from 100 nm to 25 µm.

In the case of a wire mainly made of GaN, the crystal structure of the wire may be of wurtzite type, the wire extending along axis C. The crystal structure of the wire may also be of cubic type.

Active layer 30 is the layer from which most of the radiation provided by device 10 is emitted. According to an example, active layer 30 may comprise confinement means, such as multiple quantum wells. It is for example formed of an alternation of GaN and of InGaN layers having respective thicknesses from 5 to 20 nm (for example, 8 nm) and from 1 to 10 nm (for example, 2.5 nm). The GaN layers may be doped, for example of type N or P. According to another example, the active layer may comprise a single InGaN layer, for example, having a thickness greater than 10 nm.

Semiconductor layer 32 enables to form a P-N or P-I-N junction with active layer 30 and/or upper portion 28. It enables to inject holes into active layer 30 via electrode 38.

The stack of semiconductor layers 32 may comprise an electron barrier layer 40 formed of a ternary alloy, for example, made of aluminum gallium nitride (AlGaN) or of aluminum indium nitride (AlInN) in contact with active layer 30 and an additional layer 42, to provide a good electric contact between second electrode 38 and active layer 30, for example, made of gallium nitride (GaN) in contact with electronic barrier layer 40 and with electrode 38. Semiconductor layer 42 is doped with the conductivity type opposite to that of portion 28, for example, P-type doped. Electron barrier layer 40 may be of the same conductivity type as semiconductor layer 42.

Insulating portions 34 are capable of preventing the forming of a direct electric contact between lower portion 26 of each wire 24 and electrode 38. Insulating portions 34 may be conformally arranged, for example, by CVD. Insulating portions 34 may be made of a dielectric material, for example, silicon oxide ($SiO_2$), silicon nitride ($Si_xN_y$, where x is approximately equal to 3 and y is approximately equal to 4, for example, $Si_3N_4$), aluminum oxide ($Al_2O_3$), hafnium oxide ($HfO_2$), or diamond.

Reflective portions 36 are for example made of aluminum, of silver, or of ruthenium and for example have a thickness greater than 100 nm.

Second electrode 38 is capable of biasing active layer 30 of each wire 24 and of letting through the electromagnetic radiation emitted or received by wires 24. The material forming electrode 38 may be a transparent and conductive material such as indium-tin oxide (or ITO), aluminum zinc oxide, or graphene.

In the present example, wires 24 are formed on islands 18 which are separate elements distributed on substrate 14. As a variation, seed islands 18 may be replaced with a seed layer covering surface 16 of substrate 14. The seed layer may be covered with an insulating layer comprising openings which expose portions of the seed layer, the wires growing on the exposed portions of the seed layer.

Seed islands 18, or the seed layer, should meet several constraints.

First, seed islands 18 or the seed layer should allow the growth of wires 24.

Second, seed islands 18 or the seed layer should prevent the diffusion of the group-III element, in particular gallium, from each wire 24 towards substrate 14. Indeed, the diffusion of the group-III element into substrate 14 would cause the creation of an alloy of silicon and of the group-III element which is prejudicial to the obtaining of materials of good quality for the forming of an optoelectronic device.

Third, seed islands 18 or the seed layer should allow the flowing of a current between each wire 24 and substrate 14 when electrodes 12 and 38 are properly biased. However, the materials currently used to form seed islands 18 or the seed layer generally have insulating properties. This is true for aluminum nitride (AlN). The thickness of each seed island 18 or of the seed layer should thus be sufficiently low for the electrons to be able to cross it by tunnel effect. For this purpose, the thickness of each seed island 18 or of the seed layer is generally lower than 2 nm.

Figure 2:
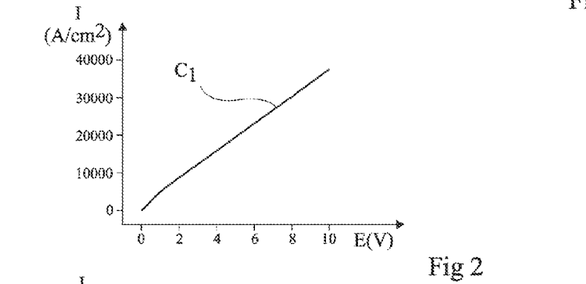
FIGS. 2 and 3 show curves of the variation of the current flowing through each microwire or nanowire of the optoelectronic device of FIG. 1 according to the bias voltage between the device electrodes.

FIG. 2 shows a curve $C_1$ of the variation of the intensity of the surface current, expressed in $A/cm^2$, crossing seed islands 18 having a 1-nm thickness according to the voltage applied between electrodes 38 and 12. Curve $C_1$ has been obtained with an N-type doped silicon substrate 14 with $10^{19}$-atom/$cm^3$ dopant concentration, with N-type doped AlN seed islands at a $10^{17}$-atom/$cm^3$ dopant concentration. Curve $C_1$ shows the flowing of a current through seed islands 18.

Figure 3:
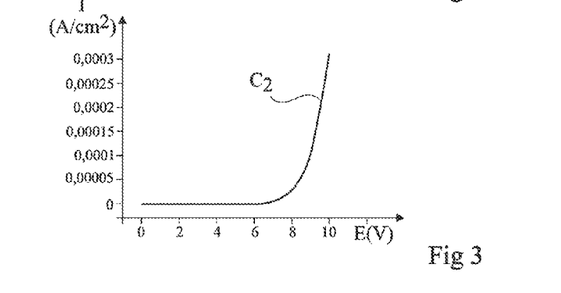

FIG. 3 shows a curve $C_2$ of the variation of the intensity of the surface current crossing seed islands 18, obtained for an optoelectronic device identical to that which has been used to obtain curve $C_1$ of FIG. 2, with the difference that the thickness of each seed island 18 is approximately 5 nm. As shown in FIG. 3, when the thickness of seed islands 18 is too large, no current flow can be observed through seed islands 18 for a bias voltage lower than 10 V.

The passing by tunnel effect of electrons through seed islands 18 is favored when substrate 14, seed islands 18, and lower portions 26 of wires 24 are heavily-doped at least at the interfaces between these regions. An additional problem then appears in the case where the substrate is made of silicon. Indeed, when seed islands 18 are made of AlN, aluminum may diffuse towards silicon substrate 14. Aluminum is a P-type dopant for silicon. Thereby, the diffusion of aluminum in substrate 14 tends to decrease the value of the N-type doping of substrate 14 at the interface between substrate 14 and seed islands 18. The improvement of the passing by tunnel effect of electrons through seed islands 18 due to the increase in N-type dopant concentrations is then not obtained.

Thus, an object of an embodiment is to overcome at least part of the disadvantages of optoelectronic devices, particularly comprising microwires or nanowires, and of their previously-described manufacturing methods.

Another object of an embodiment is to improve the current flow through each seed island or through the seed layer, in particular for the current to be able to flow through each seed island or through the seed layer when the seed islands or the seed layer have a thickness greater than 2 nm.

Another object of an embodiment is that each three-dimensional element, especially each wire, made of semiconductor material, substantially has a single-crystal structure.

Another embodiment provides the possibility of accurately and uniformly controlling the position, the geometry, and the crystallographic properties of each three-dimensional element, especially of each wire, made of semiconductor material.

Another embodiment provides the possibility of forming the three-dimensional elements, and especially the wires, made of semiconductor material, at an industrial scale and at low cost.

According to an embodiment, it is provided to use a doped semiconductor substrate of a conductivity type opposite to the conductivity type of the seed islands or of the seed layer and of the lower portion of the wires. A tunnel junction is thus obtained at the interface between each seed island and the substrate.

An advantage is that the thickness of the seed islands or of the seed layer may be increased.

Advantageously, the seed islands or the seed layer are N-type doped and the substrate is P-type doped. The diffusion of aluminum from the seed islands to the underlying substrate then tends to increase the substrate doping at the interface between the substrate and the seed islands, which is favorable to the forming of the tunnel junction.

Figure 4:
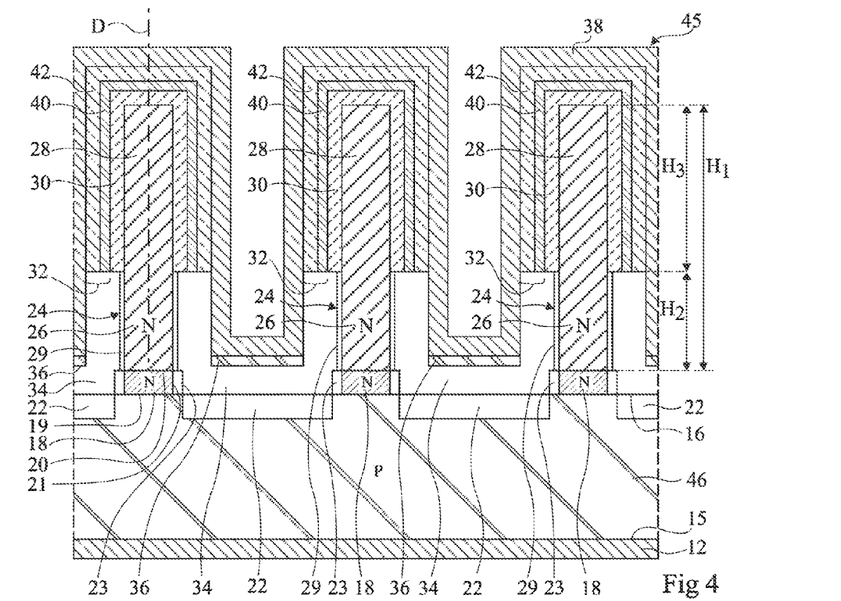
FIG. 4 is a partial simplified cross-section view of an embodiment of an optoelectronic device comprising microwires or nanowires.

FIG. 4 is a partial simplified cross-section view of an embodiment according to the invention of an optoelectronic device 45 formed from wires such as previously described and capable of emitting an electromagnetic radiation.

Optoelectronic device 45 comprises all the elements of optoelectronic device 10 previously described in relation with FIG. 1, except that N-type doped substrate 14 is replaced with a P-type doped substrate 46. Preferably, the P-type dopant concentration of substrate 46 is greater than $10^{19}$ atoms/cm$^3$, preferably in the range from $10^{19}$ atoms/cm$^3$ to $10^{21}$ atoms/cm$^3$.

Islands 18 for example have a thickness in the range from 1 to 500 nanometers, preferably from 1 to 60 nanometers, more preferably from 1 nm to 10 nm, more preferably still from 2 nm to 5 nm. The N-type dopant concentration of each seed island 18 is greater than $10^{19}$ atoms/cm$^3$, preferably in the range from $10^{19}$ atoms/cm$^3$ to $10^{21}$ atoms/cm$^3$.

The N-type dopant concentration of lower portion 26 of wire 24 is greater than $10^{19}$ atoms/cm$^3$, preferably in the range from $10^{19}$ atoms/cm$^3$ to $10^{21}$ atoms/cm$^3$.

FIGS. 5A to 5I illustrate the structures obtained at successive steps of an embodiment of a method of manufacturing optoelectronic device 45 of FIG. 4.

Figure 5A:
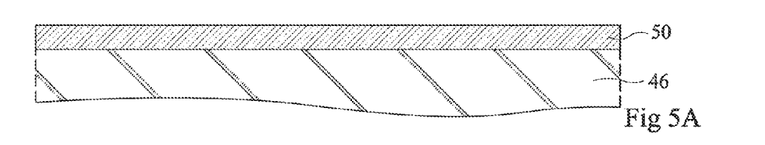
FIGS. 5A to 5I are partial simplified cross-section views of the structures obtained at successive steps of another embodiment of a method of manufacturing the optoelectronic device of FIG. 4.

The embodiment of the manufacturing method according to the invention comprises the steps of:

(1) Depositing on substrate 46 a uniform layer 50 of the material favoring the growth of the III-N compound, for example according to the N polarity (FIG. 5A). It maybe aluminum nitride. Layer 50 has, for example, a thickness in the range from 1 nm to 100 nm, preferably from 1 nm to 50 nm. Layer 50 may be obtained by a MOCVD-type method. However, methods such as CVD, MBE, GSMBE, MOMBE, ALE, HYPE, ALD (Atomic Layer Deposition), evaporation, or reactive cathode sputtering may be used, as well as any deposition type providing a textured layer. When layer 50 is made of aluminum nitride, layer 50 should be substantially textured and have a preferred polarity. The texturing of layer 50 may be obtained by an additional treatment carried out after the deposition of layer 50. It for example is an anneal under an ammonia flow ($NH_3$). Layer 50 is heavily N-type doped at least on the surface in contact with substrate 46 and on the opposite surface. This may be performed by a delta doping operation. Substrate 46 is heavily P-type doped at least on the surface in contact with layer 50. Such a heavy doping may be obtained by an overdoping by diffusion or implantation.

Figure 5B:
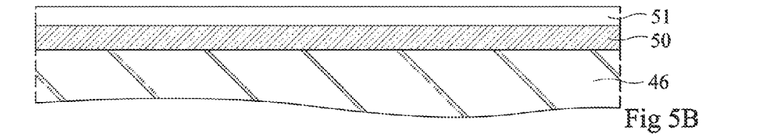

(2) Depositing a layer 51 of a dielectric material on layer 50 (FIG. 5B). Layer 51 is made of a dielectric material which may be etched selectively over the material forming layer 50. The dielectric material is, for example, silicon nitride (for example, $Si_3N_4$). Dielectric layer 51 for example has a thickness in the range from 50 to 200 nm, for example, approximately 100 nm.

Figure 5C:
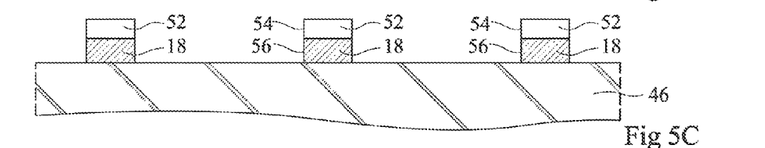

(3) Etching openings 54 in dielectric layer 51 to form portions 52, or blocks, of dielectric layer 51 and expose areas of layer 50 and etching opening 56 in layer 50 above the exposed portions of layer 50 to form islands 18 (FIG. 5C). The etching of openings 54 may be carried out by a step of selective etching which causes no etching of layer 50. It may be an etching using a sulfur hexafluoride plasma ($SF_6$). The etching of openings 56 may correspond to a dry or wet etching stopping on substrate 46. As a variation, the etching of openings 56 maybe a reactive ion etching or RIE, an inductively-coupled plasma or ICP etching, or a wet etching.

Figure 5D:
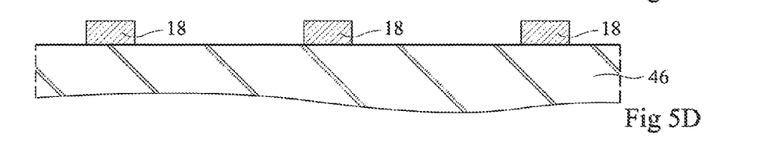

(4) Removing portions 52 (FIG. 5D). The removal of portions 52 of the dielectric layer may be carried out by a selective etch step which causes no etching of pads 18 and of substrate 46. It may be an etching using a sulfur hexafluoride plasma ($SF_6$) or a chlorinated plasma, or a BOE-type (Buffered Oxide Etch) wet etching using a mixture of ammonium fluoride ($NH_4F$) and of hydrofluoric acid (HF).

Figure 5E:
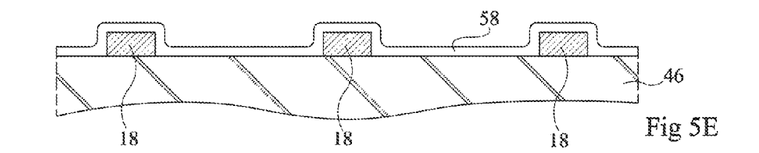

(5) Depositing a layer 58 of a dielectric material on seed islands 18 and on substrate 46 (FIG. 5E). This preferably is a conformal or substantially conformal deposition. Layer 58 is made of a dielectric material which may be etched selectively over the material forming islands 18 and substrate 46. Layer 58 is for example made of silicon nitride (for example, $Si_3N_4$), of silicon oxide ($SiO_2$), or of a silicide of the materials previously described for the forming of seed islands 18. Layer 58 has, for example, a thickness at least equal to one third of the thickness of seed islands 18, and, in particular, a thickness in the range from 5 nm to 200 nm, for example, equal to approximately 100 nm.

Figure 5F:
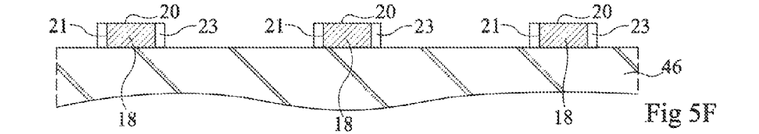
Figure 5G:
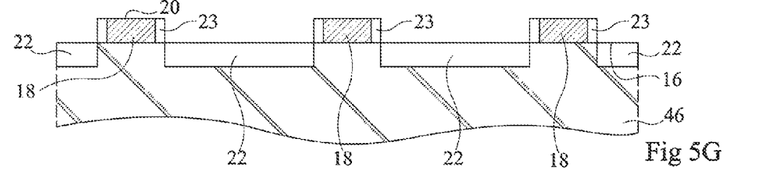

(6) Anisotropically etching layer 58 to remove the portions of layer 58 covering substrate 46 and tops 20 of islands 18 and to keep portions 23 of layer 58 covering lateral sides 21 of islands 18 (FIG. 5F). This etching is selective over the material forming substrate 14 and the material forming seed islands 18. It for example is an ion etching or a reactive ion etching.

(7) Forming region 22 by a method of nitriding the exposed areas of substrate 46 (FIG. 5G) which are not covered with islands 18. Region 22 is essentially made of silicon nitride. The obtained silicon nitride depth should be sufficient to prevent any etching by the group-III element, for example, gallium, of the material forming substrate 46. The depth of region 22 may be in the range from 5 nm to 100 nm, preferably greater than or equal to 10 nm. Region 22 may partly extend under islands 18. The nitriding conditions are selected so that substrate 46 however remains in electric contact with each island 18. Further, an overthickness may appear at the level of region 22. The nitriding step may be carried out with ammonia in a dedicated furnace or in an epitaxy reactor. The nitriding temperature may vary from 900 to 1,100° C. and the nitriding time may vary from a few minutes to one hour. A nitriding of tops 20 of islands 18 favorable to the subsequent growth of lower portions 26 of wires 24 is further obtained. The nitriding method may be carried out in a plurality of steps. As an example, in particular, when the islands are made of aluminum (possibly doped with silicon), the nitriding step may comprise a first nitriding phase which may be carried out at a first temperature, for example, in the range between 400 and 750° C., followed by a second nitriding phase carried out at a second temperature greater than the first temperature, for example, in the range from 800 to 1,100° C. The first phase promotes the nitriding of top 20 of each island 18 while the second phase promotes the nitriding of the portions of substrate 46 which are not covered with islands 18.

Figure 5H:
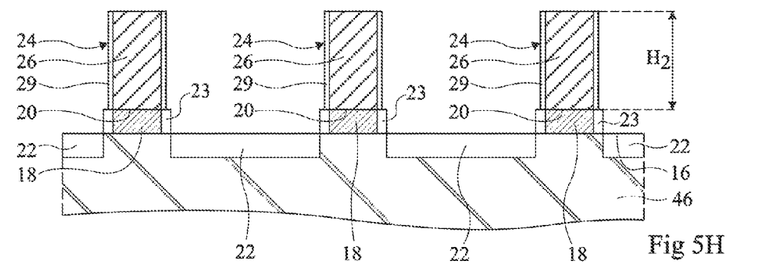
Figure 5I:
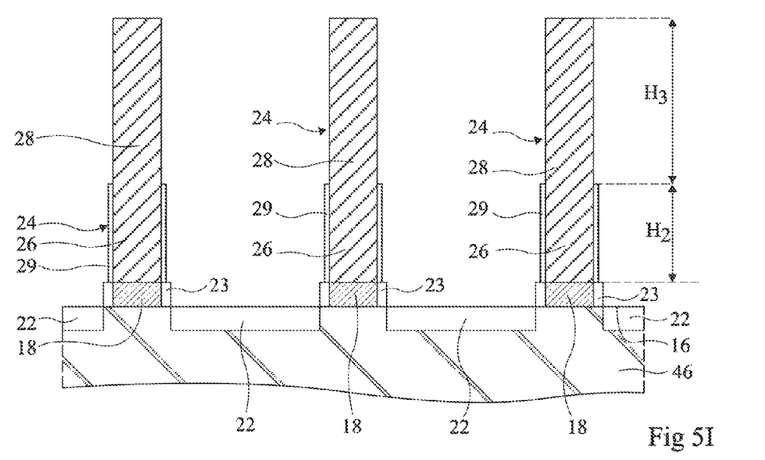

(8) Growing passivated portion 26 of each wire 24 up to height $H_2$ (FIG. 5H). Each wire 24 grows from surface 20 at the top of a seed island 18. Lower portion 26 of each wire 24 may be obtained by a MOCVD-type method. However, methods such as CVD, MBE, GSMBE, MOMBE, PAMBE, ALE, HYPE, or electrochemical methods may be used.

As an example, in the case where upper portion 26 is made of heavily-doped N-type GaN, a MOCVD-type method may be implemented by injection, into a showerhead-type MOCVD reactor, of a gallium precursor gas, for example, trimethylgallium (TMGa) and a nitrogen precursor gas, for example, ammonia ($NH_3$). As an example, a showerhead-type 3×2" MOCVD reactor commercialized by AIXTRON, may be used. A molecular flow ratio between trimethylgallium and ammonia within the 5-200 range, preferably within the 10-100 range, enables to favor the growth of wires. As an example, a carrier gas which ensures the diffusion of metal-organic elements all the way into the reactor charges with metal-organic elements in a TMGa bubbler. The latter is adjusted according to the standard operating conditions. A flow of 60 sccm (standard cubic centimeters per minute) is for example selected for TMGa, while a 300-sccm flow is used for $NH_3$ (standard $NH_3$ bottle). A pressure of approximately 800 mbar (800 hPa) is used. The gaseous mixture further comprises silane injected into the MOCVD reactor, which material is a precursor of silicon. The silane may be diluted in hydrogen at 1,000 ppm and a 20-sccm flow is provided. The temperature in the reactor is for example in the range from 950° C. to 1,100° C., preferably from 990° C. to 1,060° C. To transport species from the outlet of the bubblers to the two reactor plenums, a 2,000-sccm flow of carrier gas, for example, $N_2$, distributed between the two plenums, is used. The previously-indicated gas flows are given as an indication and should be adapted according to the size and to the specificities of the reactor.

The presence of silane among the precursor gases results in an incorporation of silicon within the GaN compound. Further, this results in the forming of silicon nitride layer 29 which covers the periphery of portion 26 of height $H_2$, except for the top along the growth of portion 26.

(9) Growing upper portion 28 of height $H_3$ of each wire 24 (FIGS. 5I) on the top of lower portion 26. For the growth of upper portion 28, the previously-described MOCVD reactor operating conditions are, as an example, maintained but for the fact that the silane flow in the reactor is decreased, for example, by a factor greater than or equal to 10, or stopped. Even when the silane flow is stopped, an active portion may be N-type doped due to the diffusion in this active portion of dopants originating from the adjacent passivated portions or due to the residual doping of GaN.

The method comprises the additional steps of:

(10) Forming, for each wire 24, active layer 30 by epitaxy. Given the presence of passivating portion 23 on lateral sides 21 of seed island 18 and of passivating portion 29 covering the periphery of lower portion 26, the deposition of active layer 30 only occurs on upper portion 28 of wire 24;

(11) Forming by epitaxy, for each wire 24, electron barrier layer 40 and semiconductor layer 42;

(12) Forming insulating portions 34. Insulating portions 34 may be formed by conformally depositing an insulating layer over the entire structure, depositing a resin layer between wires 24, etching the insulating layer which is not covered with the resin to expose semiconductor layer 42, and removing the resin.

(13) Forming reflective portions 36; and (14) Forming electrodes 38 and 12.

According to a variation of previously-described optoelectronic device 45, the protection of lateral sides 21 of pads 18 and the protection of front surface 16 of substrate 46 may be achieved by forming, after the forming of pads 18, a dielectric region covering the portions of surface 16 of substrate 46 which are not already covered with pads 18 and further covering lateral sides 21 of pads 18.

Figure 6:
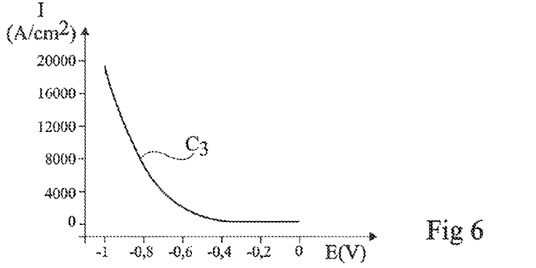
FIGS. 6 and 7 show curves of the variation of the current flowing through each nanowire or microwire of the optoelectronic device of FIG. 5 according to the voltage applied between the device electrodes.

FIG. 6 shows a curve $C_3$ of the variation of the intensity of the surface current flowing through seed islands 18 having a 15-nm thickness according to the voltage applied between electrodes 38 and 12. Curve $C_3$ has been obtained with a P-type doped silicon substrate 46 with a $10^{20}$-atom/$cm^3$ dopant concentration, with N-type doped AlN seed islands at a $10^{20}$-atom/$cm^3$ dopant concentration, and with GaN wires 24 having N-type doped lower portions 26 with a $10^{20}$-atom/$cm^3$ dopant concentration. Curve $C_3$ shows the flowing of a current through seed islands 18 as soon as the voltage is lower than −0.4 V.

Figure 7:
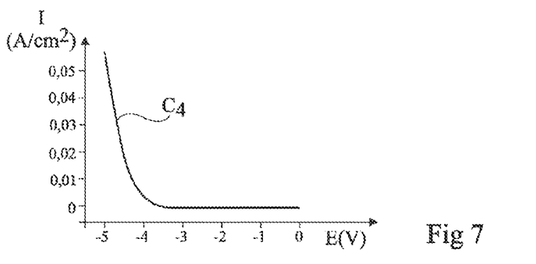

FIG. 7 shows a curve $C_4$ of the variation of the current flowing through seed islands 18, obtained for an optoelectronic device identical to that which has been used to obtain curve $C_3$ of FIG. 6, with the difference that the dopant concentration of each seed island 18 is approximately $10^{19}$ atoms/$cm^3$. As shown in FIG. 3, when the dopant concentration of seed islands 18 is not sufficient, no current flow can be observed through seed islands 18 for a bias voltage between −4 V and 0 V.

Figure 8:
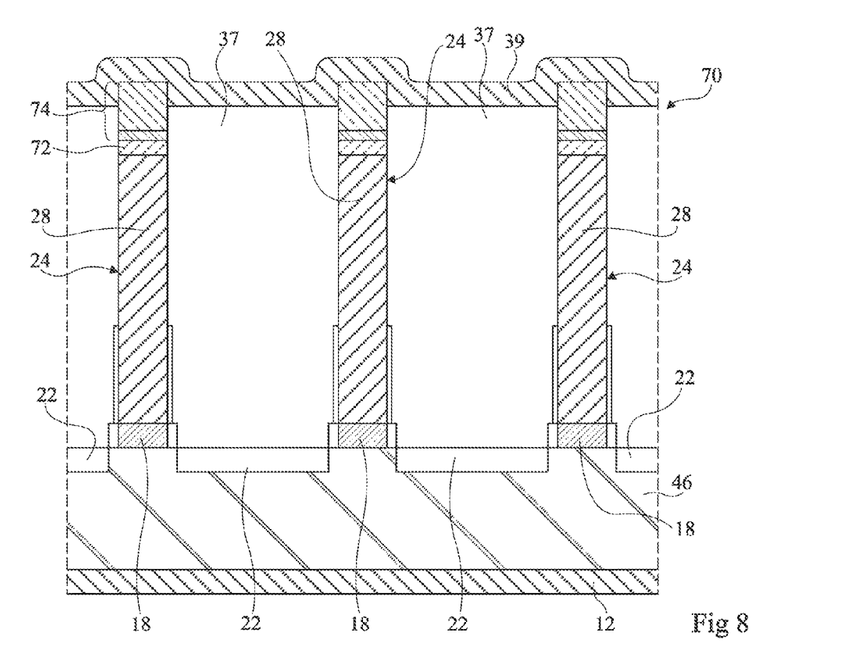
FIG. 8 is a partial simplified cross-section view of another embodiment of an optoelectronic device comprising microwires or nanowires.

FIG. 8 is a partial simplified cross-section view of another embodiment of an optoelectronic device 70 which is capable of emitting an electromagnetic radiation. Device 70 differs from device 10 particularly by the shape of the active portion of each wire 24. Indeed, for each wire 24, active portion 72 only covers the top of wire 24. Active portion 72 may have the same composition as previously-described active layer 30. Further, a stack of semiconductor portions 74 covers active portion 72. The stack of semiconductor layers 74 may have the same composition as previously-described stack 32.

Specific embodiments of the present invention have been described. Various alterations, modifications, and improvements will occur to those skilled in the art. In particular, although embodiments where the wires, covered with a first electrode, are formed on a first surface of a support while a second electrode is formed on a second surface of the support, opposite to the first surface, have been shown in the drawings. It should however be clear that the second electrode may be provided on the side of the first surface.

Further, although, in the previously-described embodiments, each wire 24 comprises a passivated portion 26 at the base of the wire in contact with top 20 of a seed island 18, passivated portion 26 may be absent.

Further, while the different previously-described embodiments of optoelectronic devices are capable of emitting an electromagnetic radiation, such devices can easily be adapted by those skilled in the art to receive an electromagnetic radiation and convert it into an electric signal. Active layer 30 then is the layer where most of the radiation received by the device is captured. Such an adaptation is performed by adapting both active layer 30, 72 of each of wires 24 and by applying an adequate biasing to the semiconductor structure. Such an adaptation of device 10, 70 may be performed to form either an optoelectronic device dedicated to measuring or detecting an electromagnetic radiation, or an optoelectronic device dedicated to photovoltaic applications.

Further, although embodiments have been described for an optoelectronic device comprising seed islands covering a substrate, it should be clear that the optoelectronic device may comprise a seed layer covering the substrate, the seed layer being itself covered with an insulating layer for which openings are provided to expose portions of the seed layer, the wires growing in the openings. In this case, the tunnel junction is formed over the entire interface between the seed layer and the underlying substrate.

The invention claimed is:

1. An optoelectronic device comprising:
   a doped semiconductor substrate of a first conductivity type;
   semiconductor pads or a semiconductor layer on a surface of the substrate doped with a second conductivity type opposite to the first type; and
   semiconductor elements, each semiconductor element being in contact with a pad or with the layer,
   wherein the substrate is made of a first semiconductor material selected from the group comprising silicon, germanium, a silicon-germanium alloy, silicon carbide, a III-V compound, such as GaN, GaAs, GaP, or GaSb, or ZnO, and a combination of these compounds, wherein the semiconductor pads or the semiconductor layer are made of a material selected from the group comprising aluminum nitride, boron nitride, silicon carbide, magnesium nitride, magnesium gallium nitride, or a combination thereof and of their nitrided compounds, and wherein each semiconductor element is at least partially covered with a semiconductor structure capable of emitting or of capturing light; and
   wherein each semiconductor element is a microwire, a nanowire, a conical or tapered element with a polygonal base.

2. The optoelectronic device of claim 1, wherein the dopant concentration of the pads or of the layer is greater than $10^{19}$ atoms/cm$^3$.

3. The optoelectronic device of claim 1, wherein the dopant concentration of the is greater than $10^{19}$ atoms/cm$^3$.

4. The optoelectronic device of any of claim 1, wherein each semiconductor element comprises at least a portion, in contact with the associated pad or with the layer, doped with the second conductivity type.

5. The optoelectronic device of claim 4, wherein, for each semiconductor element, the dopant concentration of the portion of the semiconductor element is greater than $10^{19}$ atoms/cm$^3$.

6. The optoelectronic device of claim 1, further comprising a portion covering at least the lateral sides of each pad, said portion preventing the growth of the semiconductor elements on the lateral sides.

7. The optoelectronic device of claim 1, further comprising a dielectric region extending in the substrate from said surface and connecting, for each pair of pads, one of the pads in the pair to the other pad in the pair.

8. The optoelectronic device of claim 1, wherein the substrate is made of silicon.

9. The optoelectronic device of claim 4, wherein said portion mainly comprises a second semiconductor material selected from the group comprising silicon, germanium, silicon carbide, a III-V compound, a II-VI compound, and a combination of these compounds.

10. The optoelectronic device of claim 1, wherein the thickness of each pad is in the range from 1 nm to 100 nm and wherein the substrate is in electric contact with each pad.

11. A method of manufacturing an optoelectronic device, comprising the successive steps of:
   providing a doped semiconductor substrate of a first conductivity type;
   forming, on a surface of the substrate, semi-conductor pads or a semiconductor layer doped with a second conductivity type opposite to the first type; and
   forming semiconductor elements, each semiconductor element being in contact with a pad or with the layer,
   wherein the substrate is made of a first semiconductor material selected from the group comprising silicon, germanium, a silicon-germanium alloy, silicon carbide, a III-V compound, such as GaN, GaAs, GaP, or GaSb, or ZnO, and a combination of these compounds, wherein the semiconductor pads or the semiconductor layer are made of a material selected from the group comprising aluminum nitride, boron nitride, silicon carbide, magnesium nitride, magnesium gallium nitride, or a combination thereof and of their nitrided compounds, and wherein each semiconductor element is at least partially covered with a semiconductor structure capable of emitting or of capturing light; and
   wherein each semiconductor element is a microwire, a nanowire, a conical or tapered element with a polygonal base.

\* \* \* \* \*